(12) United States Patent
Arcoleo et al.

(10) Patent No.: US 6,445,645 B2
(45) Date of Patent: Sep. 3, 2002

(54) RANDOM ACCESS MEMORY HAVING INDEPENDENT READ PORT AND WRITE PORT AND PROCESS FOR WRITING TO AND READING FROM THE SAME

(75) Inventors: Mathew R. Arcoleo, San Jose; Cathal G. Phelan, Mountain View; Ashish Pancholy; Simon J. Lovett, both of Milpitas, all of CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/878,434

(22) Filed: Jun. 11, 2001

Related U.S. Application Data

(62) Division of application No. 09/238,953, filed on Jan. 27, 1999, now Pat. No. 6,262,936.
(60) Provisional application No. 60/077,982, filed on Mar. 13, 1998.

(51) Int. Cl.[7] .................................................. G11C 8/00
(52) U.S. Cl. ............. 365/233; 365/230.05; 365/189.04; 365/189.12; 365/189.05
(58) Field of Search ............................... 365/233, 233.5, 365/230.05, 189.04, 189.12, 189.05

(56) References Cited

U.S. PATENT DOCUMENTS

| | | | |
|---|---|---|---|
| 4,169,284 A | 9/1979 | Hogan et al. ................ 711/140 |
| 4,245,304 A | 1/1981 | Porter et al. ................ 711/122 |
| 4,456,965 A | 6/1984 | Graber et al. ............... 710/100 |
| 4,539,661 A | 9/1985 | Oritani ..................... 365/233.5 |
| 4,575,826 A | 3/1986 | Dean ......................... 365/222 |
| 4,599,708 A | 7/1986 | Schuster ..................... 365/174 |
| 4,752,871 A | 6/1988 | Sparks et al. .......... 365/185.11 |
| 4,783,732 A | 11/1988 | Morton ................... 365/230.05 |
| 4,849,937 A | 7/1989 | Yoshimoto ............... 365/189.05 |
| 4,882,709 A | 11/1989 | Wyland ................... 365/189.02 |
| 5,023,838 A | 6/1991 | Herbert .................. 365/189.08 |
| 5,309,395 A | 5/1994 | Dickinson et al. ...... 365/189.04 |
| 5,394,361 A | 2/1995 | Dickinson .............. 365/189.04 |
| 5,440,717 A | 8/1995 | Bosshart ..................... 711/159 |
| 5,530,673 A | 6/1996 | Tobita et al. ........... 365/185.09 |
| 5,546,569 A | 8/1996 | Proebsting et al. ......... 713/600 |
| 5,561,781 A | 10/1996 | Braceras et al. ............ 711/131 |
| 5,598,545 A | 1/1997 | Childers et al. ............ 712/221 |
| 5,638,534 A | 6/1997 | Mote, Jr. ..................... 711/158 |
| 5,648,987 A | 7/1997 | Yang et al. .................. 375/232 |
| 5,752,270 A | 5/1998 | Wada .......................... 711/169 |
| 5,781,480 A | 7/1998 | Nogle et al. ........... 365/189.04 |
| 5,784,331 A | * 7/1998 | Lysinger ................ 365/230.06 |
| 5,805,523 A | * 9/1998 | Lysinger ................ 365/230.08 |
| 5,828,606 A | 10/1998 | Mick ...................... 365/189.05 |
| 5,838,631 A | 11/1998 | Mick ......................... 365/233 |
| 5,841,732 A | 11/1998 | Mick ......................... 365/233 |
| 5,875,151 A | 2/1999 | Mick ......................... 365/233 |
| 5,923,615 A | * 7/1999 | Leach et al. ............. 365/238.5 |

(List continued on next page.)

Primary Examiner—Andrew Q. Tran
(74) Attorney, Agent, or Firm—Christopher P. Maiorana, P.C.

(57) ABSTRACT

A random access memory with a read port, a write port, a read/write control signal configured to control data transfer operations at the read port and/or the write port on both rising and falling transitions, and a first random access memory array configured to store and/or retrieve data at a first random address in the first random access memory array defined by one or more signals on a write address bus and/or a read address bus. One preferred embodiment further includes a write data register storing or latching data in response to a first transition of the read/write control signal, and the array storing data in response to a second transition of the read/write control signal. Other preferred embodiments further include an n·m-bits-wide input data bus coupling a set of data inputs to the write data register, and/or an n·m-bits-wide output data bus coupling the read data register to a set of data outputs, where n and m are each independently an integer >2.

5 Claims, 5 Drawing Sheets

U.S. PATENT DOCUMENTS

| | | | |
|---|---|---|---|
| 5,926,426 A | 7/1999 | Han | 365/205 |
| 5,956,286 A | 9/1999 | Lattimore et al. | 365/230.05 |
| 5,978,279 A | 11/1999 | Park | 365/189.04 |
| 5,983,328 A | 11/1999 | Potts et al. | 711/157 |
| 6,069,839 A | 5/2000 | Pancholy et al. | 365/233 |
| 6,081,478 A | 6/2000 | Mick et al. | 365/233 |
| 6,094,399 A | 7/2000 | Mick | 365/233 |
| 2001/0043506 A1 * | 11/2001 | Arcoleo et al. | 365/233 |

* cited by examiner

RANDOM ACCESS MEMORY HAVING INDEPENDENT READ PORT AND WRITE PORT AND PROCESS FOR WRITING TO AND READING FROM THE SAME

This is a divisional of U.S. Ser. No. 09/238,953, filed Jan. 27, 1999, now U.S. Pat. No. 6,262,936.

This application claims the benefit of U.S. Provisional Application No. 60/077,982, filed Mar. 13, 1998, and is hereby incorporated by reference in its entirety.

BACKGROUND OF THE INVENTION

This invention relates generally to the field of semiconductor and/or integrated circuit devices, and more particularly to a random access memory and process for writing to and reading from the same.

Summary of the Invention

The primary object of the invention is to provide a random access memory that increases data throughput.

Another object of the invention is to provide such a random access memory that may have either synchronous or asynchronous operation.

Another object of the invention is to provide a random access memory and method of operating the same in which read and write operations may be executed in the same clock cycle.

A further object of the invention is to provide a random access memory and method of operating the same in which read and write operations may be asynchronously enabled.

Yet another object of the invention is to provide such a random access memory and method of operating the same in which fully random addresses may be employed.

Still yet another object of the invention is to provide such a random access memory and method of operating the same in which successive and/or asserted addresses may be completely unrelated.

Another object of the invention is to provide such a random access memory and method of operating the same in which no restrictions are placed on successive and/or asserted addresses .

Another object of the invention is to provide such a random access memory and method of operating the same in which the same address may be used to read from and write to the memory in the same clock cycle.

A further object of the invention is to provide such a random access memory and method of operating the same in which a read/write control signal (e.g., a clock or control pulse) is the only control-type signal essential to operability.

Other objects and advantages of the present invention will become apparent from the following description, taken in connection with the accompanying drawings, wherein, by way of illustration and example, embodiments of the present invention are disclosed.

The present invention concerns a random access memory comprising: a write port comprising a set of data inputs and a write address bus, a read port comprising a set of data outputs and a read address bus, a read/write control signal configured to control data transfer operations at said write port and/or said read port in response to either (i) both rising and falling transitions or (ii) each of two logic levels of said read/write control signal, and a first random access memory array configured to store and/or retrieve data at a first random address in said first random access memory array defined by one or more signals on said write address bus and/or said read address bus.

In a further embodiment, the present invention concerns a process for reading data from and/or writing data to a random access memory array, comprising the steps of: (a) transferring a first plurality of data bits to or from a first random address in said random access memory array in response to a first transition of a read/write control signal, and (b) independently transferring a second plurality of data bits to or from a second random address in said random access memory array in response to a second transition of said read/write control signal.

BRIEF DESCRIPTION OF THE DRAWINGS

The drawings constitute a part of this specification and include exemplary embodiments to the invention, which may be embodied in various forms. The features and advantages of the present invention are illustrated by way of example in the drawings, in which.

Figure 1:
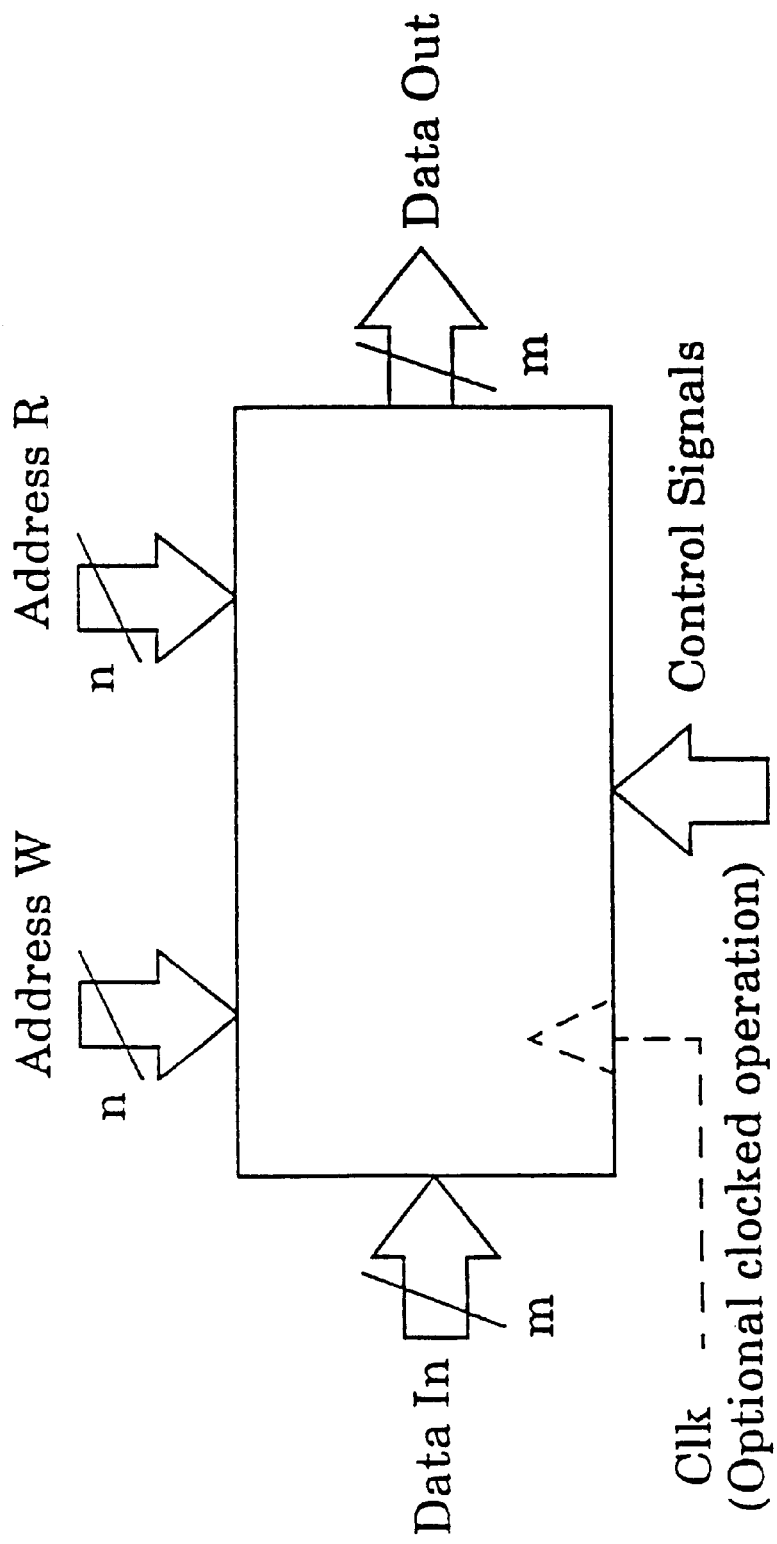
FIG. 1 shows an overview of the present random access memory (RAM) architecture.

It is to be understood that, in some instances, various aspects of the invention may be shown exaggerated or enlarged to facilitate an understanding of the invention, and in other instances, some aspects of the invention considered to be conventional may not be shown so as to avoid obfuscating more important aspects or features of the invention.

DETAILED DESCRIPTION OF THE PREFERRED EMBODIMENTS

Detailed descriptions of the preferred embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure or manner.

In the present random access memory, each of the read port and write port elements (i.e., the write address bus, the set of data inputs, the read address bus and the set of data outputs) may independently be m or n·m bits wide, where m is an integer $\geq 2$, preferably $\geq 4$, and more preferably $\geq 8$, and n is independently an integer ≧2, preferably of 2–4, and more preferably equal to 2. In specific examples, m may be 8, 9, 18, 32, 36, 64, 72, 128 or 144. When the port is, for example, a read port or an input port, the port may receive data from an external source. In a preferred embodiment, each port is unidirectional (i.e., data flows in one direction only; e.g., a read port functions as a dedicated output port and a write port functions as a dedicated input port).

The read/write control signal may be configured to control one or more data transfer operations at the first port and/or the second port on both its rising and falling transitions in a synchronous or asynchronous manner. Thus, a "read/write control signal" refers to any signal that controls any circuit function performed as part of a read operation or a write operation. For asynchronous operations, the read/write control signal may be a pulse signal generated, for example, in response to a first transition of a write address signal or an input data signal. For synchronous operations, the read/write control signal may be a periodic signal, such as an internal or external clock signal. There may be more than one independent read/write control signal controlling read, write, register and/or data pass gate functions. Where appropriate and/or desirable, the read/write control signals may comprise a first pulse or clock signal and its complement.

The present random access memory array may be configured to store and/or retrieve data at any random address therein. The address is defined by one or more signals on the write address bus and/or the read address bus.

The present random access memory may further comprise circuitry operable to write data into the array at a first random address in response to at least one transition of a read/write control signal. Preferably, the transition(s) of the read/write control signal to which such write circuitry responds generates a write enable or other write operation control signal in accordance with techniques and circuitry known to those skilled in the art.

Similarly, the present random access memory may further comprise circuitry operable to read data from a random location in the array in response to at least one transition of the read/write control signal, where the transition(s) of the read/write control signal to which such read circuitry responds generates a read enable or other read operation control signal in accordance with techniques and circuitry known to those skilled in the art.

As shown in FIG. 1, the present random access memory (RAM) architecture comprises separate first and second ports (e.g., "Data In" and "Data Out") to access the memory array. Each port may have one or more dedicated address inputs (e.g., "Address W" and "Address R") to maintain complete independence of the ports and their associated control logic.

When one of the ports operates as a read port, it may have dedicated Data Outputs from the array to support Read operations. Similarly, when one of the ports operates as a write Port, it may have dedicated Data inputs to the array to support Write operations. Separated data inputs and outputs substantially or completely eliminates the need to "turn around" the data bus as may be required with common I/O devices. Accesses to the Read and Write ports may be completely independent of one another and may be initiated synchronously with one or more read/write control signals (e.g., a control pulse generated in response to a first transition of a data input signal or write address signal; an internal or external clock signal; a set of differential input clocks; etc.). In order to maximize data throughput, both Read and Write ports may transfer data on one or both of the rising and falling edges of the read/write control signal(s) (e.g., optional input clock "Clk"). Data transfer may also be logic level-triggered; i.e., it may occur in response to a particular or predetermined logic level of one or more read/write control signal(s).

The depth of the memory array may be, in effect, expanded with two or more RAM devices (e.g., integrated circuit chips) and their associated select logic circuitry. The port select inputs allow each port to operate as if it was an independent device, thereby further allowing depth expansion independently on each port.

All synchronous inputs may be passed through one or more write registers (or input registers) controlled by the read/write control signal(s). All data outputs may be passed through one or more read registers (and/or output registers), also controlled by the same or different read/write control signal(s).

All writes may be conducted with on-chip synchronous self-timed write circuitry to simplify the interface logic.

EXAMPLE(S)

Figure 2:
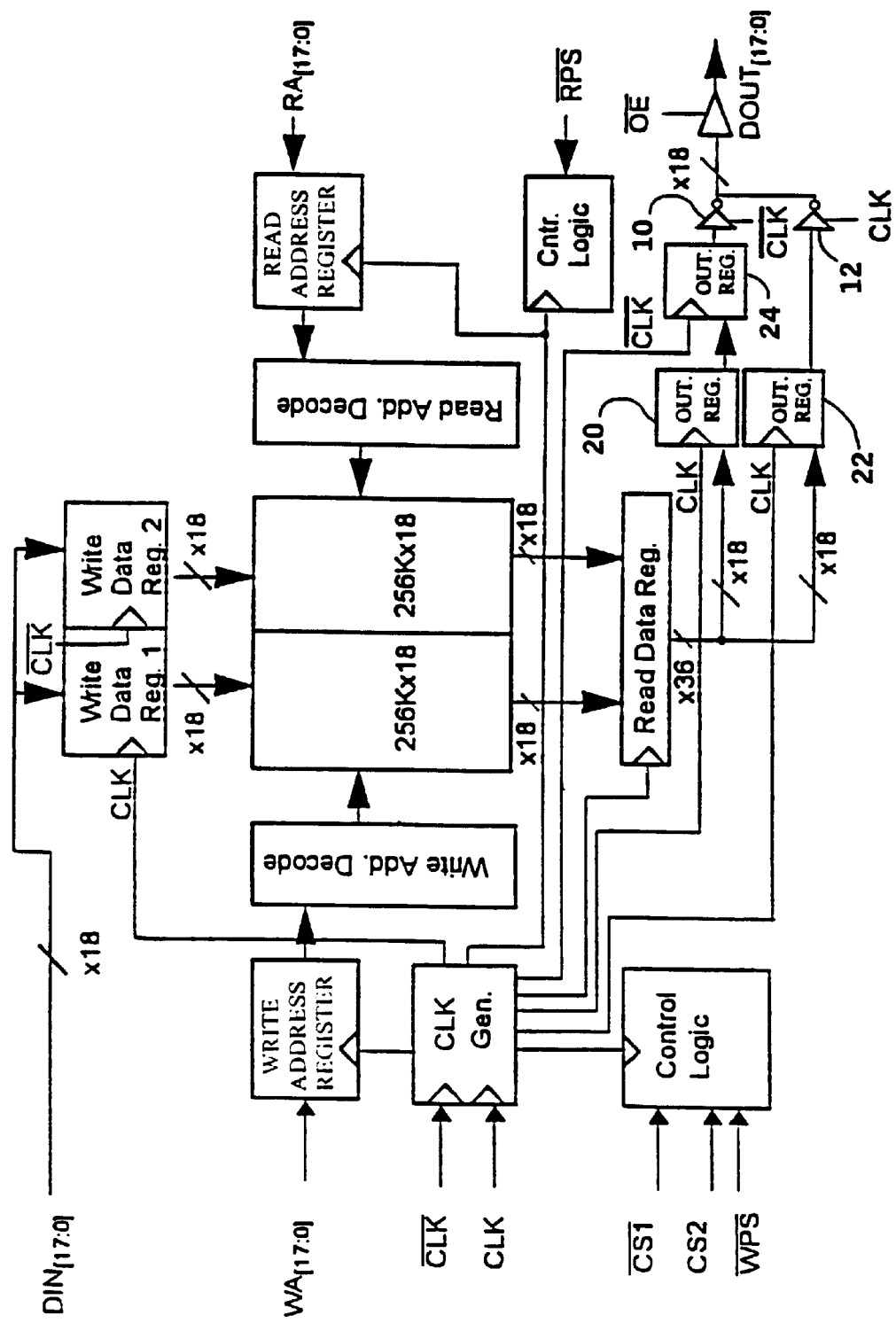
FIG. 2 shows a more detailed embodiment of the RAM architecture shown in FIG. 1.

As shown in FIG. 2, the present RAM architecture is, in a preferred embodiment, configured as a synchronous pipelined Burst static RAM (SRAM) equipped with both an Input (write) Port and an Output (read) Port. The Read port is dedicated to Read operations and the Write Port is dedicated to Write operations. Data flows into the SRAM through the Write port, and out through the Read Port. Each port has its own address inputs (which may store or latch address data in separate read and write address registers) that allow it to operate independently. By separating the input and output ports, the present RAM avoids possible data contention and/or eliminates any need to "turn-around" the data bus.

Accesses for both ports may be controlled by a single clock or a pair of differential input clocks (CLK/CLK*, where a signal designated "X*" indicates the complement of the corresponding signal "X", similar to the signals in the Figures bearing an overstrike or "bar" designation). All synchronous timing may be referenced from the cross point of the differential input clock signals. Accesses can be initiated on any edge of any read/write control signal (preferably on the rising edge of a clock signal, assuming any other control signals are asserted at their active logic levels), but for ease and simplicity of logic circuitry, accesses are initiated on the rising edge of the positive clock (CLK) only.

All data inputs (e.g., synchronous inputs DIN[17:0]) may pass through one or more input registers (e.g., first and second registers WRITE DATA REG. 1 and WRITE DATA REG. 2 as shown in FIG. 2) controlled by the rising and falling edge of the positive input clock (CLK). Although the random access memory shown in FIG. 2 comprises first and second write data registers, a single 2 m-bit-wide write data register can substitute for the two m-bit-wide registers. In such a case, a 2 m-bit-wide data input bus may also be substituted for the m-bit-wide data input bus shown. The first m-bit or single n·m-bit write data register may store data in response to a first transition of the read/write control signal, and when present, the second write data register may store data in response to a second transition of the read/write control signal. In either case, the data in the write data register(s) is written into the array on the second transition of the read/write control signal, when the full 2 m-bit-wide word in latched into the write register(s).

The present random access memory may comprise first and second m-bit-wide arrays configured to store and/or retrieve data at a random address in each cell array defined by one or more signals on the write address bus and/or the read address bus, respectively. Alternatively, the present random access memory may comprise a n·m-bit-wide array, in which case the write data register and read data register are also n·m bits wide, and preferably, the internal and/or external data input and output busses are also n·m bits wide.

When the random access memory comprises a plurality of arrays (e.g., as shown in FIG. 2), the first random access memory array receives data from the first write data register, and the second random access memory array receives data from the second write data register. Similarly, a random access memory comprising a plurality of arrays may further comprise a plurality of read data registers, the first read data register storing data transferred from the first random access memory array, and the second write data register storing data transferred from the second random access memory. In this case, the present random access memory may further comprise (a) first circuitry operable to write data to the random access memory array(s) at a first random address and (b) second circuitry operable to read data from the random access memory array(s) at a second random address, in response to successive or non-successive transitions of a read/write control signal, the second random address being the same as or different from the first random address.

All data outputs (e.g., synchronous outputs DOUT[17:0]) may pass through one or more output registers (e.g., 2m-bit-wide READ DATA REG., which may in the alternative be configured as first and second m-bit-wide read data registers) controlled by the rising and falling edge of the positive input clock (CLK). The read data register(s) may store data transferred from the random access memory array in response to a first transition of a read/write control signal. The random access memory shown in FIG. 2 may further comprise an m-bits-wide output data bus having first and second inputs respectively coupled to first and second read data registers. Alternatively, the present random access memory may comprise an n·m-bits-wide output data bus receiving n·m bits of data from an n·m-bits-wide read data register (or n m-bits-wide read data registers; the same principles may apply to the data input bus and the write data register[s]).

As shown in FIG. 2, the present random access memory may further comprise an m-bits-wide data output bus, first and second three-state output buffers (e.g., buffers 10 and 12), and first, second and third m-bits-wide output registers (e.g., Reg. 20, Reg. 22 and Reg. 24), wherein:

each of the first and second output registers store m bits of data from the read data register in response to a first read/write control signal, the third output register stores m bits of data from the first output register in response to a second read/write control signal (which may be a complement of the first read/write control signal), the first three-state output buffer is enabled to provide data to the output data bus from the third output register by a third read/write control signal (which may be [i] the same as or different from the second read/write control signal or [ii] a complement of the first read/write control signal, and which preferably enables data output in a particular or predetermined logic level or state), and the second three-state output buffer is enabled to provide data to the output data bus from the second output register in response to a fourth read/write control signal (which may be [i] the same as or different from the first read/write control signal or [ii] a complement of the second read/write control signal, and which also preferably enables data output in a particular or predetermined logic level or state).

Alternatively, where the output data bus is n·m bits wide, one may substitute a single n·m-bits-wide output register and an optional output buffer (which may have three-state enablement as set forth above), n m-bits-wide output registers each with an optional output buffer (having optional three-state control as described above), or one may simply omit the output register(s) and/or output buffers completely.

Control inputs (e.g., one or more synchronous read port select inputs RPS or RPS*, one or more synchronous write port select inputs WPS or WPS*, etc.) may pass through input registers controlled by an edge of a read/write control signal (e.g., the rising edge of the positive clock input CLK). One may advantageously employ multiple read and/or write port select inputs (e.g., RPS1, RPS2, RPS1*, RPS2*, WPS1, WPS2, WPS1*, WPS2*, etc.) when one includes multiple random access memories in a given application (e.g., a data, voice and/or video communications device, such as a network switch or router). Preferably, each RAM in a given multiple-RAM application has at least one unique combination of read and at write port select signals that activate the particular port (e.g., RPS1* and RPS2, RPS1 and RPS2*, WPS1* and WPS2, WPS1 and WPS2*, etc.). Alternatively, the different read and/or write port select signals can select (enable or disable) one read or write register of a multiple-register configuration.

Transferring Data To and From the Array

In a further embodiment, the present invention relates to a process for reading data from and/or writing data to a random access memory array, comprising the steps of:

transferring a first plurality of data bits to or from a first random address in said random access memory array in response to a first transition of a read/write control signal, and independently transferring a second plurality of data bits to or from a second random address in said random access memory array in response to a second transition of said read/write control signal.

Reading

Figure 3:
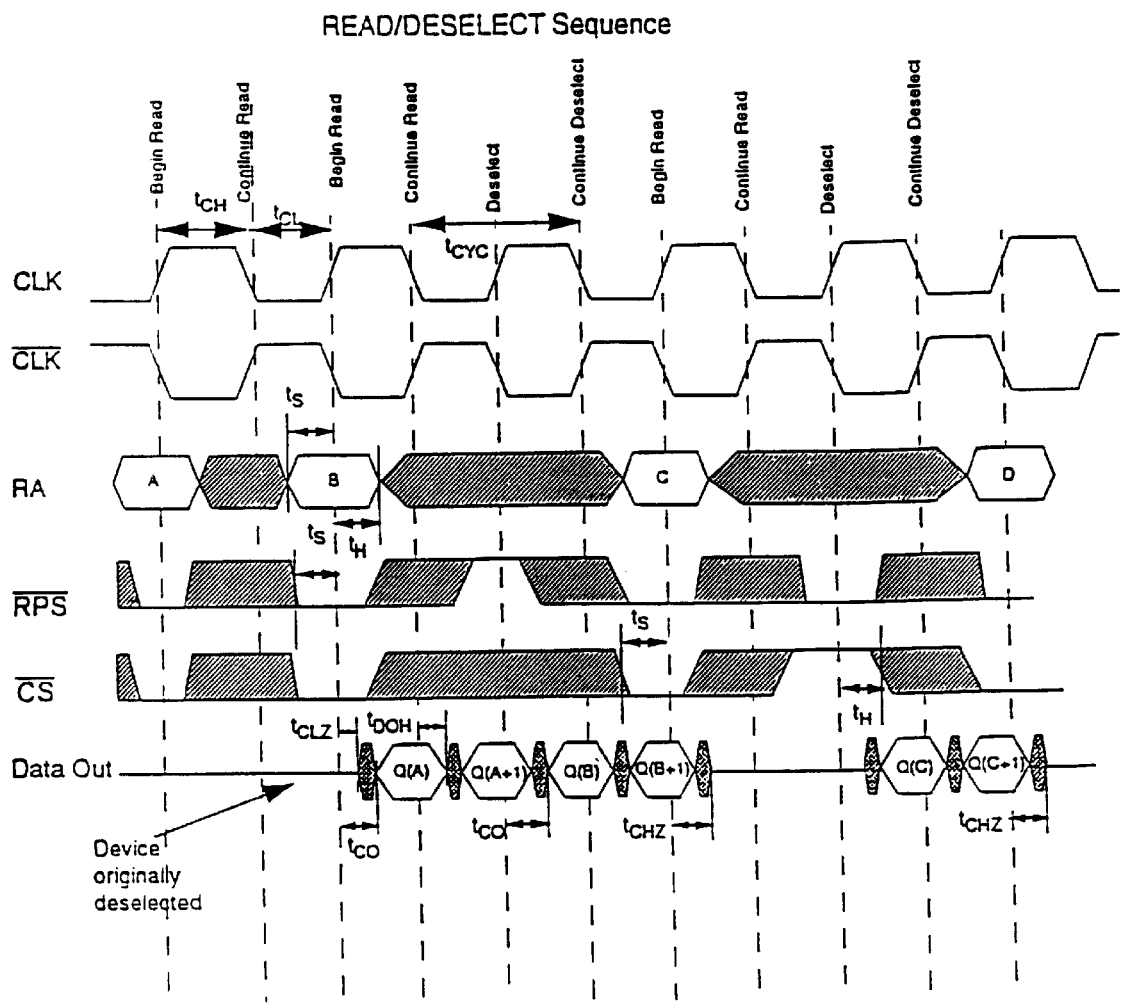
FIG. 3 shows various waveforms illustrating relative timing of various signals in conjunction with an exemplary read operation performed according to the invention.
Figure 4:
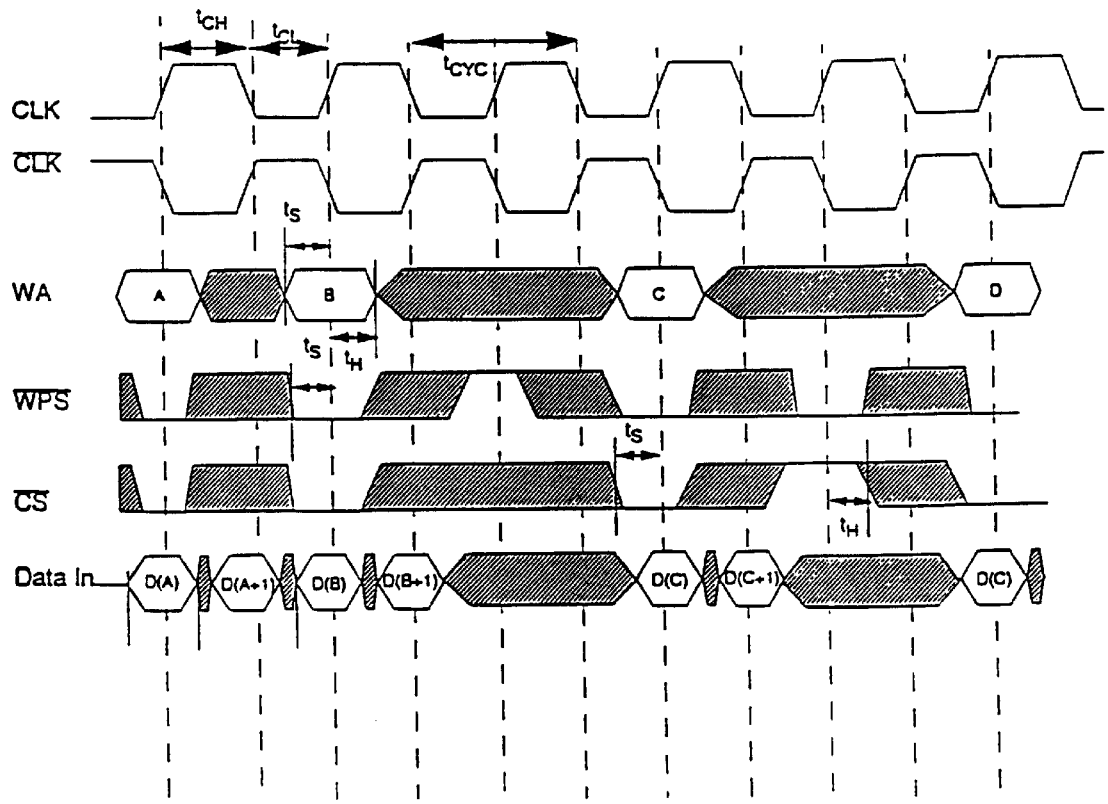
FIG. 4 shows various waveforms illustrating relative timing of various signals in conjunction with an exemplary write operation performed according to the invention.

As shown in FIG. 3, read operations may be initiated by asserting a read port select signal (e.g., RPS*) that is active at an appropriate read/write control signal edge (e.g., positive clock rise [also see the CLK waveform]). The addresses on RA[17:0] may be stored in the Read address register, preferably on (in response to) the same read/write control signal edge as for reading from the array. The RAM may access two data words with each read operation on the same clock edge as that which latches the read address. For example, referring to FIG. 2, the two data words (or double-width data word) may be driven from the Read Data Reg. to output registers 20 and 22 on a single clock edge, then the first or lower word of data may be driven through output buffer 12 onto the output data bus DOUT on the clock logic level resulting from the single clock edge that latches the data in output register 22, provided any applied output control signal (e.g., an output enable signal OE) is asserted in an enabling state (e.g., LOW). On the subsequent clock transition, the second or higher order data word stored in Writing As shown in FIG. 4, write operations may be initiated by asserting a write port select signal (e.g., WPS*) that is active at an appropriate read/write control signal edge (e.g., positive clock rise [also see the CLK waveform]). The addresses presented to WA[17:0] may be stored in the write address register on the same positive clock rise as that which initiates the write operation. In addition, the information presented to the data inputs (e.g., DIN[17:0]) may be stored in the first (or a single) Write Data register on this same positive clock rise. On the following edge of the read/write control signal (e.g., the

TABLE 1

Read Port Cycle Description Truth Table[1,2]

| Operation | Address used | RPS2 | $\overline{RPS1}$ | CLK | Comments |
|---|---|---|---|---|---|
| Deselected | — | X | H | L-H | $\overline{RPS1}$ deselects Read Port. Outputs three-state following next rising edge of positive clock (CLK) |
| Deselected | — | 0 | X | L-H | RPS2 deselects Read Port. Outputs three-state following next rising edge of positive clock (CLK) |
| Begin Read | External | 1 | 0 | L-H | Read operation initiated on previous clock rise. Address are stored in the Read Address Register. Following the next clock rise the first (lower order) word will be driven out onto $DOUT_{[17:0]}$ provided $\overline{OE}$ is driven LOW. On the subsequent failing edge of the positive clock (CLK) the second (higher order) word is driven out onto $DOUT_{[17:0]}$ provided $\overline{OE}$ is driven LOW. If the asynchronous $\overline{OE}$ is HIGH, the output buffers will remain in a three-state condition |

Notes:
[1]X = Don't Care.
1 = Logic HIGH.
0 = Logic LOW.
[2]Device will power-up deselected and the outputs in a three-state condition, regardless of $\overline{OE}$.

output register 20 may be latched in output register 24, then driven through output buffer 10 onto the DOUT signals on the clock logic level resulting from the clock transition that latches the second data word in output register 24, provided any applied out control signal remains asserted in an enabling state. In this configuration, all data may be available, for example, as soon as 3.5 ns after clock rise (assuming a 125 MHz read/write control signal), providing a read operation with essentially no cycles of latency.

Read accesses can be initiated on every rising edge of the positive clock. Doing so will "pipeline" the data flow such that data is transferred out of the device on every rising and falling edge of the clock.

When deselected, the present RAM may first complete the pending read transactions. Synchronous internal circuitry may automatically three-state the outputs following the next rising edge of the positive clock. This will allow for a seamless transition between a port in the present RAM and any external device (including without limitation a second RAM according to the invention) without the insertion of wait states.

Table 1 below shows a truth table for the read port in the exemplary read operation. The identity and description of signal names in Table 1 can be found in Table 3 below.

falling edge of the positive clock), the information presented to DIN[17:0] is stored in the second Write Data Register (see also the architecture example shown in FIG. 2). On this following read/write control signal edge (and optionally, a subsequently asserted write contol signal such as a write enable signal WE generated by a conventional pulse generator from a rising clock transition, and applied to the wordline(s) of the RAM array corresponding to the address stored in the write address register), the corresponding 2m-bit-wide word of data is written into the array.

Write accesses can be initiated on every rising edge of the positive clock (or its complement). Doing so will pipeline the data flow such that data is transferred into the device on every rising and falling edge of the clock.

When deselected, the write port will ignore all inputs to the write port.

Table 2 below shows a truth table for the write port in the exemplary write operation. The identity and description of signal names in Table 2 can be found in Table 3 below.

TABLE 2

Write Port Cycle Description Truth Table

| Operation | Address used | WPS2 | $\overline{\text{WPS1}}$ | CLK | Comments |
|---|---|---|---|---|---|
| Deselected | — | X | H | L-H | $\overline{\text{WPS1}}$ deselects Write Port. All Write Port inputs are ignored. |
| Deselected | — | 0 | X | L-H | WPS2 deselects Write Port. All Write Port inputs are ignored. |
| Begin Read | External | 1 | 0 | L-H | Read operation initiated. Address are stored in the Read Address Register. Following the next clock rise the first (lower order) word will be driven out onto $\text{DOUT}_{[17:0]}$ provided $\overline{\text{OE}}$ is driven LOW. On the subsequent falling edge of the positive clock (CLK) the second (higher order) word is driven out onto $\text{DOUT}_{[17:0]}$ provided $\overline{\text{OE}}$ is driven LOW. If the asynchronous $\overline{\text{OE}}$ is HIGH, the output buffers will remain in a three-state condition |

The Read and Write ports in the present RAM architecture may operate completely independently of one another. Since each port may have an independent address input, one can Read or Write to any location in the memory array, regardless of the transaction on the other port. Should the Read and Write ports access the same location on the same edge of the read/write control signal (e.g., on the rising edge of the positive clock), the information presented to the data inputs is forwarded to the data outputs (by, e.g., conventional bypass logic circuitry responsive to a control signal generated in response to an AND- or NAND-type logic comparison of the read and write addresses). Alternatively, the data stored in the read data register may first be output on the data output bus, then the same location written with the new data.

The present RAM architecture may have one or more Port Select inputs for each port, allowing for easy depth expansion. Port Selects may be sampled on any edge of any read/write control signal, but is preferably sampled on the rising edge of the positive clock input (CLK). Either port select input can deselect the specified port (e.g., an active read port select deselects the read port). Deselecting a port will not affect the other port. All pending transactions (Read and/or Write) are preferably completed prior to the port being deselected.

Reading and Writing

Figure 5:
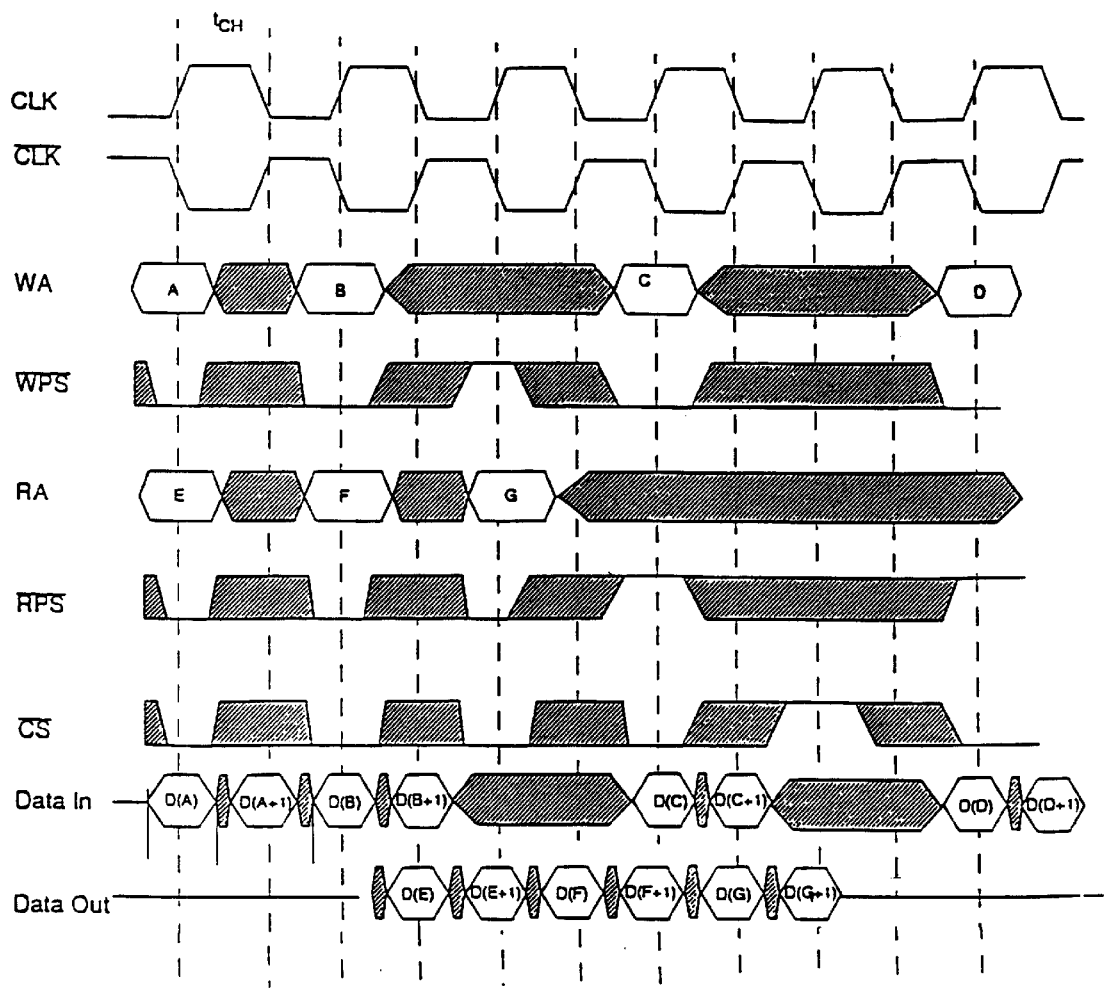
FIG. 5 shows various waveforms illustrating relative timing of various signals in conjunction with an exemplary read/write operation performed according to the invention.

FIG. 5 shows the sequence of data transfer events occurring during substantially simultaneous read and write operations. Table 3 below shows the identity and description of the exemplary input signals shown and/or described in FIGS. 1–5. The letters "A", "B", "C", etc., refer to addresses (e.g., word addresses for m-bit-wide words) in the RAM array. The terms "D(A)", "D(B)", etc., and "D(A+1)", "D(B+1)", etc., respectively refer to a first or lower order data word and a second or higher order data word written to or read from the corresponding address "A", "B", "C", etc. (Alternatively, for 2 m-bit-wide circuitry, "D(A)" and "D(A+1)", "D(B)" and "D(B+1)", etc., refer to a single 2 m-bit-wide data word.) In this example, the signal "CS*" represents a logical combination of two external chip select signals (see CS1 and CS2 in Table 3 below).

As shown on FIG. 5, when an address A is written into the write address register along bus WA, the write port select signal is asserted briefly (and preferably while the read/write control signal(s) CLK and/or CLK* is/are transitioning). The first transition of the read/write control signal CLK latches the first data word D(A) on the Data In bus in the first write register, and the next transition of the read/Write control signal CLK latches the next data word D(A+1) on the Data In bus into the second write register. (Alternatively, for 2 m-bit-wide circuitry, the first transition of the read/write control signal CLK latches a single 2 m-bit-wide data word in a single write data register.) The data words D(A) and D(A+1) may then be written into address A in the first and second arrays, respectively, as shown for example in FIG. 2. Writing into the array(s) may be controlled by a synchronous or asynchronous control signal as described above (e.g., a rising CLK edge or a subsequently asserted, independently generated write enable signal), or alternatively, writing to the array(s) may not be gated or controlled by a control signal.

Similarly, when an address E is latched into the read address register along bus RA, the read port select signal is asserted briefly (and preferably while the read/write control signal is transitioning). The first transition of the read/write control signal latches data word(s) D(E) and D(E+1) from address E in the array(s) (e.g., into registers 20 and 22 in FIG. 2) and outputs D(E) to the data outputs. For m-bit-wide circuitry, a complementary transition of the read/write control signal may then latch data word D(E+1) through a shadow register (e.g., register 24 in FIG. 2) and onto the data output bus and the data outputs.

While the invention has been described in connection with certain preferred embodiments, it is not intended to limit the scope of the invention to the particular form set forth, but on the contrary, it is intended to cover such alternatives, modifications, and equivalents as may be included within the spirit and scope of the invention as defined by the appended claims.

TABLE 3

| Pin Number Name | I/O | Description |
|---|---|---|
| $DIN_{[17:0]}$ | Input-Synchronous | Data input signals, sampled on the rising and subsequent falling edge of CLK during the data portion of the write operations. The Data presented to $DIN_{[17:0]}$ can be read from the device on $DOUT_{[17:0]}$. |
| $\overline{WPS1}$ WPS2 | Input-Synchronous | Write Port Selects, active LOW and HIGH, respectively. Sampled on the rising edge of CLK. When active, a write operation is initiated. $\overline{WPS1}$ and WPS2 are qualified with chip selects ($\overline{CS1}$ and CS2) |
| $WA_{[17:0]}$ | Input-Synchronous | Write Address inputs. Sampled on the rising edge of the CLK during a write operation. These inputs are ignored during the falling edge of the positive clock (CLK). These inputs are qualified with $\overline{WPS}$, $\overline{CS1}$ and CS2. |
| $DOUT_{[17:0]}$ | Outputs | Data Outputs signals. These pins drive out the requested data during a Read operation. The data driven out on $DOUT_{[17:0]}$ is the same data written in on $DIN_{[17:0]}$. |
| $\overline{RPS1}$ RPS2 | Input-Synchronous | Read Port Selects, active LOW and HIGH, respectively. Sampled on the rising edge of CLK. When active, a read operation is initiated. $\overline{RPS1}$ and RPS2 are qualified with chip selects ($\overline{CS1}$ and CS2) |
| $RA_{[17:0]}$ | Input-Synchronous | Read Address inputs. Sampled on the rising edge of the CLK during a read operation. These inputs are ignored during the falling edge of the positive clock (CLK). These inputs are qualified with $\overline{RPS}$, $\overline{CS1}$ and CS2. |
| $\overline{OE}$ | Input-Asynchronous | Output Enable, active LOW. This is an asynchronous input that controls the output drivers of the device. When deselected using $\overline{RPS}$, the output drivers are automatically three-stated, regardless of the state of $\overline{OE}$. |
| $\overline{CS1}$ | Input-Synchronous | Chip Selects 1, active LOW. Sampled on the rising edge of the positive clock (CLK). This signal is used in conjunction with CS2 to select or deselect the device. |
| CS2 | Input-Synchronous | Chip Selects 2, active HIGH. Sampled on the rising edge of the positive clock (CLK). This signal is used in conjunction with $\overline{CS1}$ to select or deselect the device. |
| CLK | Input-Clock | Positive Clock input. Used to capture all synchronous inputs to the device. All accesses are initiated on the rising edge of CLK. The crosspoint of CLK and $\overline{CLK}$ are used to capture all synchronous inputs to the device. |
| $\overline{CLK}$ | Input-Clock | Negative Clock input. Complimentary to CLK. The crosspoint of CLK and $\overline{CLK}$ are used to capture all synchronous inputs to the device. CLK is used to capture DIN and drive DOUT. |
| $V_{DD}$ | Power Supply | Power supply inputs to the core of the device. Should be connected to 2.5 V power supply. |
| $V_{SS}$ | Ground | Ground for the core of the device. Should be connected to ground of the system. |
| $V_{DDQ}$ | Power Supply | Power supply inputs for the outputs of the device. Should be connected to 2.5 V power supply. |
| $V_{SSQ}$ | Ground | Ground for the outputs of the device. Should be connected to ground of the system. |

What is claimed is:

1. A process for reading data from and/or writing data to a random access memory array, comprising the steps of:

(A) transferring a first plurality of data bits either to or from a first random address in response to a first transition or logic level of a read/write control signal, and (B) independently transferring a second plurality of data bits either to or from a second random address in response to a second, complementary transition or logic level of said read/write control signal.

2. The process of claim 1, wherein step (A) comprises a write operation and step (B) comprises a read operation.

3. The process of claim 1, wherein step (A) comprises a read operation and step (B) comprises a write operation.

4. The process of claim 1, wherein step (A) comprises a first read operation and step (B) comprises a second read operation.

5. The process of claim 1, wherein step (A) comprises a first write operation and step (B) comprises a second write operation.

* * * * *